(12) United States Patent
Nickel et al.

(10) Patent No.: US 9,274,142 B2
(45) Date of Patent: Mar. 1, 2016

(54) TESTING SYSTEM WITH CAPACITIVELY COUPLED PROBE FOR EVALUATING ELECTRONIC DEVICE STRUCTURES

(75) Inventors: Joshua G. Nickel, San Jose, CA (US); Jr-Yi Shen, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 1068 days.

(21) Appl. No.: 13/097,847

(22) Filed: Apr. 29, 2011

(65) Prior Publication Data
US 2012/0274346 A1  Nov. 1, 2012

(51) Int. Cl.
*G01R 31/20* (2006.01)
*G01R 1/07* (2006.01)
*G01R 31/312* (2006.01)

(52) U.S. Cl.
CPC ............... *G01R 1/07* (2013.01); *G01R 31/312* (2013.01)

(58) Field of Classification Search
CPC .................................. G01R 1/07; G01R 31/312
USPC ....................................... 324/754.03
See application file for complete search history.

(56) References Cited

U.S. PATENT DOCUMENTS

| | | | |
|---|---|---|---|
| 5,561,378 A * | 10/1996 | Bockelman et al. ...... | 324/754.07 |
| 5,570,011 A * | 10/1996 | Henley ..................... | 324/762.03 |
| 6,233,122 B1 * | 5/2001 | Summers ............... | G11B 5/484 |
| | | | 360/246 |
| 6,943,562 B2 | 9/2005 | Talanov et al. | |
| 8,742,997 B2 * | 6/2014 | Nickel et al. ................. | 343/703 |
| 9,157,954 B2 * | 10/2015 | Nickel ............... | G01R 31/3025 |
| 2004/0217765 A1 | 11/2004 | Kitaoka | |
| 2006/0023606 A1 * | 2/2006 | Lutwyche et al. ............. | 369/100 |
| 2007/0053137 A1 * | 3/2007 | Fu et al. ......................... | 361/302 |
| 2012/0068727 A1 * | 3/2012 | Rathburn ................. | 324/755.01 |
| 2012/0306521 A1 * | 12/2012 | Nickel ............... | G01R 31/3025 |
| | | | 324/754.03 |

FOREIGN PATENT DOCUMENTS

WO     2010141264     12/2010

OTHER PUBLICATIONS

Test Electronics, TE-1100 Test Fixture Kit Instructions, p. 1-31, Oct. 2010, www.testelectronics.com.*
Negishi, Effective test probe assignment on PCB electrical testing, IPC APEX EXPO PRoceedings, p. 1-3, no date.*
Condor Sigma W12, Wafer Testing 300 mm, p. 1-3, www.xyztec.com/news/70/.*

* cited by examiner

*Primary Examiner* — Thomas F Valone
(74) *Attorney, Agent, or Firm* — Treyz Law Group, P.C.; G. Victor Treyz; Joseph F. Guihan (57) ABSTRACT

Conductive electronic device structures such as a conductive housing member that forms part of an antenna may be tested during manufacturing. A test system may be provided that has a capacitive coupling probe. The probe may have electrodes. The electrodes may be formed from patterned metal structures in a dielectric substrate. A test unit may provide radio-frequency test signals in a range of frequencies. The radio-frequency test signals may be applied to the conductive housing member or other conductive structures under test using the electrodes. Complex impedance data, forward transfer coefficient data, or other data may be used to determine whether the structures are faulty. A fixture may be used to hold the capacitive coupling probe in place against the conductive electronic device structures during testing.

23 Claims, 12 Drawing Sheets

TESTING SYSTEM WITH CAPACITIVELY COUPLED PROBE FOR EVALUATING ELECTRONIC DEVICE STRUCTURES

BACKGROUND

This relates generally to testing, and more particularly, to testing electronic device structures for manufacturing faults.

Electronic devices such as portable computers and cellular telephones are often provided with wireless communications capabilities. For example, electronic devices may use long-range wireless communications circuitry such as cellular telephone circuitry and short-range wireless communications circuitry such as wireless local area network circuitry.

In some devices, conductive housing structures may form part of an electronic device antenna. The performance of this type of antenna may depend on how accurately the conductive housing structures are manufactured. Excessive variations in the size and shape of conductive electronic device housing structures may have a negative impact on the performance of antennas formed using the structures. Variations in conductive electronic device structures of other types may also impact device performance.

It would therefore be desirable to be able to provide ways to test electronic device structures such as conductive electronic device structures that form parts of antennas and other structures.

SUMMARY

Electronic devices may include conductive structures such as conductive housing structures and structures associated with device components. Conductive housing structures may form part of an antenna, part of an electromagnetic shielding can, part of a printed circuit pad, or other structures.

To ensure that conductive electronic device structures have been fabricated properly, conductive electronic device structures may be tested during manufacturing. A test system may be provided that has a capacitive coupling probe. The capacitive coupling probe may have first and second electrodes. A probe having first and second pins may be used to couple a test unit to the capacitive coupling probe.

The electrodes in the capacitive coupling probe may be formed from patterned metal pad structures in a dielectric substrate such as a flexible printed circuit substrate. A test fixture may receive the conductive electronic device structures during testing. A layer of foam in the test fixture or other biasing structures may be used to bias the capacitive coupling probe against the conductive electronic device structures. The test fixture may contain retention members that help hold the conductive electronic device structures under test within the test fixture.

A test unit may provide radio-frequency test signals in a range of frequencies. The radio-frequency test signals may be transmitted through the conductive housing member or other conductive structures under test using the first and second capacitively coupled electrodes. Complex impedance data, forward transfer coefficient data, or other data may be used to determine whether the structures are faulty.

Further features of the invention, its nature and various advantages will be more apparent from the accompanying drawings and the following detailed description of the preferred embodiments.

DETAILED DESCRIPTION

Electronic devices may be provided with wireless communications circuitry such as antennas and associated transceiver circuits. The wireless communications circuitry may be used to support wireless communications in multiple wireless communications bands. The wireless communications circuitry may include one or more antennas.

The antennas can include loop antennas, inverted-F antennas, strip antennas, planar inverted-F antennas, slot antennas, hybrid antennas that include antenna structures of more than one type, or other suitable antennas. Conductive structures for the antennas may, if desired, be formed from conductive electronic device structures. The conductive electronic device structures may include conductive housing structures. The housing structures may include a peripheral conductive member that runs around the periphery of an electronic device. The peripheral conductive member may serve as a bezel for a planar structure such as a display, may serve as sidewall structures for a device housing, or may form other housing structures. Gaps in the peripheral conductive member may be associated with the antennas.

The size of the gaps that is produced during manufacturing can influence the electrical properties of the antennas that are formed using the peripheral conductive housing members. To ensure that the gaps are formed appropriately, it may be desirable to electrically test the peripheral conductive housing member during manufacturing. The electrical test measurements may reveal undesired manufacturing variations in the gaps. Other conductive electronic device structures may also be tested in this way if desired.

Figure 1:
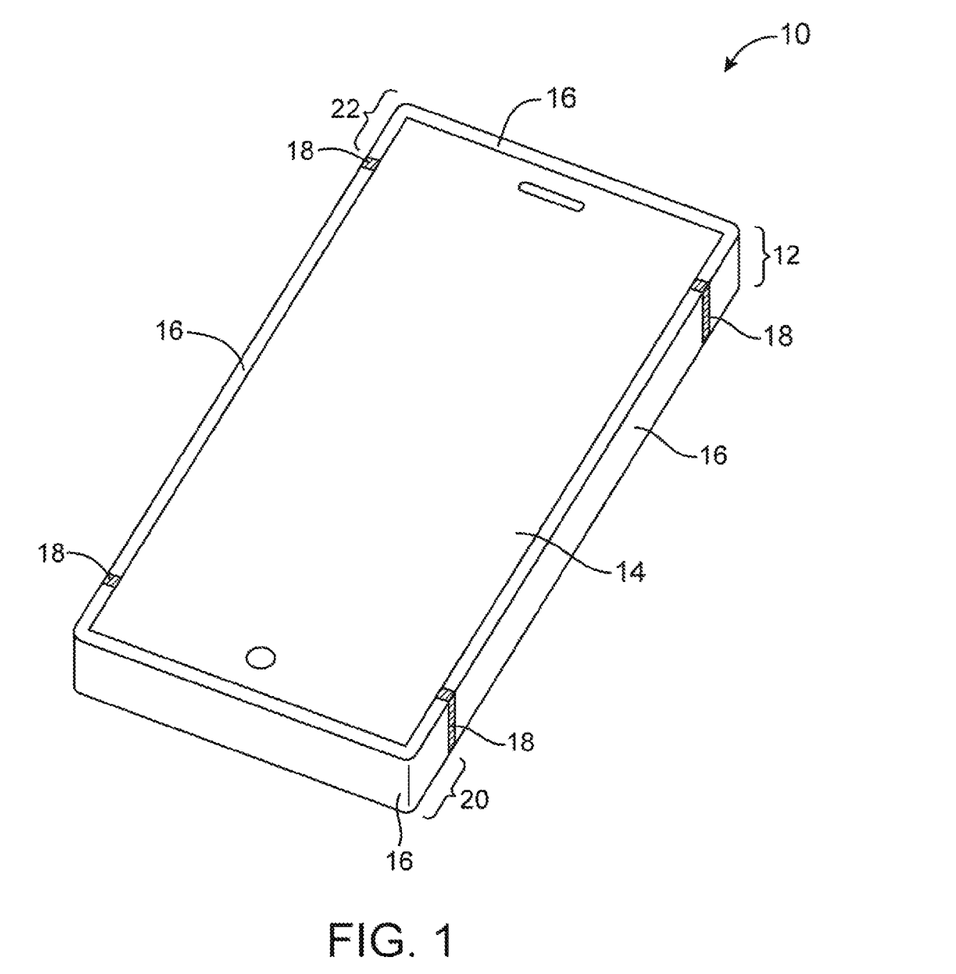
FIG. 1 is a perspective view of an illustrative electronic device of the type that may include conductive housing structures that may be tested in accordance with an embodiment of the present invention.

An illustrative electronic device of the type that may be provided with conductive electronic device structures such as a peripheral conductive housing member that forms part of one or more antennas is shown in FIG. 1. Electronic device 10 may be a portable electronic device or other suitable electronic device. For example, electronic device 10 may be a laptop computer, a tablet computer, a somewhat smaller device such as a wrist-watch device, pendant device, headphone device, earpiece device, or other wearable or miniature device, a cellular telephone, a media player, etc.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material. In other situations, housing 12 or at least some of the structures that make up housing 12 may be formed from metal elements.

Device 10 may, if desired, have a display such as display 14. Display 14 may, for example, be a touch screen that incorporates capacitive touch electrodes. Display 14 may include image pixels formed from light-emitting diodes (LEDs), organic LEDs (OLEDs), plasma cells, electronic ink elements, liquid crystal display (LCD) components, or other suitable image pixel structures. A cover glass layer may cover the surface of display 14. Buttons and speaker port openings may pass through openings in the cover glass.

Housing 12 may include structures such as housing member 16. Member 16 may run around the rectangular periphery of device 10 and display 14. Member 16 or part of member 16 may serve as a bezel for display 14 (e.g., a cosmetic trim that surrounds all four sides of display 14 and/or helps hold display 14 to device 10). Member 16 may also, if desired, form sidewall structures for device 10.

Member 16 may be formed of a conductive material and may therefore sometimes be referred to as a peripheral conductive housing member or conductive housing structures. Member 16 may be formed from a metal such as stainless steel, aluminum, or other suitable materials. One, two, or more than two separate structures may be used in forming member 16.

It is not necessary for member 16 to have a uniform cross-section. For example, the top portion of member 16 may, if desired, have an inwardly protruding lip that helps hold display 14 in place. If desired, the bottom portion of member 16 may also have an enlarged lip (e.g., in the plane of the rear surface of device 10). In the example of FIG. 1, member 16 has substantially straight vertical sidewalls. This is merely illustrative. The sidewalls of member 16 may be curved or may have any other suitable shape. In some configurations (e.g., when member 16 serves as a bezel for display 14), member 16 may run around the lip of housing 12 (i.e., member 16 may cover only the edge of housing 12 that surrounds display 14 and not the rear edge of the sidewalls of housing 12).

Display 14 may include conductive structures such as an array of capacitive electrodes, conductive lines for addressing pixel elements, driver circuits, etc. Housing 12 may include internal structures such as metal frame members, a planar housing member (sometimes referred to as a midplate) that spans the walls of housing 12 (i.e., a sheet metal structure that is welded or otherwise connected between the opposing right and left sides of member 16), printed circuit boards, and other internal conductive structures. These conductive structures may be located in center of housing 12 (as an example).

In regions 20 and 22, openings may be formed between the conductive housing structures and conductive electrical components that make up device 10. These openings may be filled with air, plastic, and other dielectrics. Conductive housing structures and other conductive structures in device 10 may serve as a ground plane for the antennas in device 10. The openings in regions 20 and 22 may serve as slots in open or closed slot antennas, may serve as a central dielectric region that is surrounded by a conductive path of materials in a loop antenna, may serve as a space that separates an antenna resonating element such as a strip antenna resonating element or an inverted-F antenna resonating element from the ground plane, or may otherwise serve as part of antenna structures formed in regions 20 and 22.

Portions of member 16 may be provided with gap structures 18. Gaps 18 be filled with dielectric such as polymer, ceramic, glass, etc. Gaps 18 may divide member 16 into one or more peripheral conductive member segments. There may be, for example, two segments of member 16 (e.g., in an arrangement with two gaps), three segments of member 16 (e.g., in an arrangement with three gaps), four segments of member 16 (e.g., in an arrangement with four gaps, etc.). The segments of peripheral conductive member 16 that are formed in this way may form parts of antennas in device 10.

Figure 2:
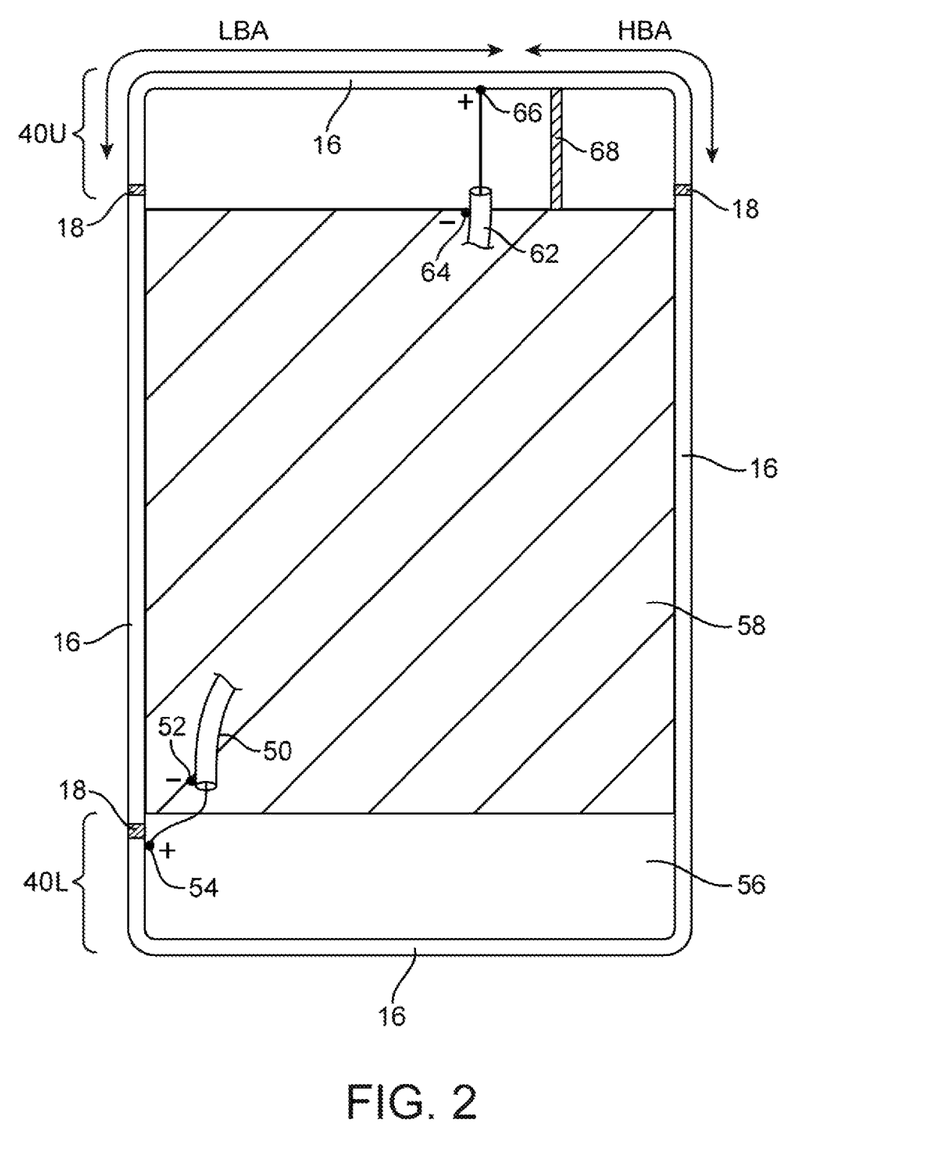
FIG. 2 is a top view of an illustrative electronic device of the type shown in FIG. 1 showing the locations of gaps in a peripheral conductive housing member and the locations of possible antennas within the electronic device in accordance with an embodiment of the present invention.

A top view of an interior portion of device 10 is shown in FIG. 2. If desired, device 10 may have upper and lower antennas (as an example). An upper antenna such as antenna 40U may, for example, be formed at the upper end of device 10 in region 22. A lower antenna such as antenna 40L may, for example, be formed at the lower end of device 10 in region 20. The antennas may be used separately to cover separate communications bands of interest or may be used together to implement an antenna diversity scheme or a multiple-input-multiple-output (MIMO) antenna scheme.

Antenna 40L may be formed from the portions of midplate 58 and peripheral conductive housing member 16 that surround dielectric-filled opening 56. Antenna 40L may be fed by transmission line 50, which is coupled to positive feed terminal 54 and ground feed terminal 52. Other feed arrangements may be used if desired. The arrangement of FIG. 2 is merely illustrative.

Antenna 40U may be formed from the portions of midplate 58 and peripheral conductive housing member 16 that surround dielectric-filled opening 60. Member 16 may have a low-band segment LBA that terminates at one of gaps 18 and a high-band segment HBA that terminates at another one of gaps 18. Antenna 40U may be fed using transmission line 62. Transmission line 62 may be coupled to positive antenna feed terminal 66 and ground antenna feed terminal 64 (as an example). Conductive member 68 may span opening 60 to form an inverted-F antenna short-circuit path. Segments LBA and HBA may form low-band and high-band cellular telephone inverted-F antennas (as an example).

Gaps 18 separate respective portions of peripheral conductive housing member 16 from each other so that these portions of conductive housing member 16 form parallel plate capacitors. The capacitance associated with a typical gap may be, for example, about 1 pF. With one suitable arrangement, the width of each gap (i.e., the dimension of the gap along the longitudinal dimension of peripheral conductive housing member 16) may be nominally about 0.7 mm.

Due to manufacturing variations, there will generally be a variation in the widths of gaps 18 from device to device. In some situations, one of gaps 18 will be narrower than desired, leading to an excessive gap capacitance Cm. In other situations, a gap may be wider than desired, leading to a value of gap capacitance Cm for that gap that is lower than desired.

Variations in capacitance and other electrical parameters associated with conductive device structures such as peripheral conductive housing member 16 and gaps 18 can have a significant impact on the performance of device 10. For example, variations in the width of gaps 18 may affect the frequencies in which antennas such as antennas 40U and 40L operate.

If desired, testing may be performed on structures other than conductive housing members. For example, conductive structure 16 may be associated with a conductive component structure such as an electromagnetic shielding can, may be associated with a printed circuit board pad, may be associated with conductive traces on other substrates, may be associated with other conductive components in device 10, etc. Structures with dielectric regions 18 other than gaps can affect radio-frequency characteristics of structures 16. For example, holes or other openings in conductive structure 16 may affect the electrical properties of structure 16. A conductive structure such as structure 16 may be formed form two sheets of metal that are separated by a thin dielectric layer 18. In this type of configuration or any other configuration where the size and shape of dielectric 18 relative to conductive material 16 affects radio-frequency signal propagation, device performance may be characterized by performing radio-frequency characterization measurements.

To ensure that gaps 18 or other conductive electronic device structures have been formed properly, a test system may be used to measure the electrical properties of the electronic device structures. For example, the capacitance of gaps 18 may be measured or other parameters such as series inductance and impedance may be measured.

Figure 3A:
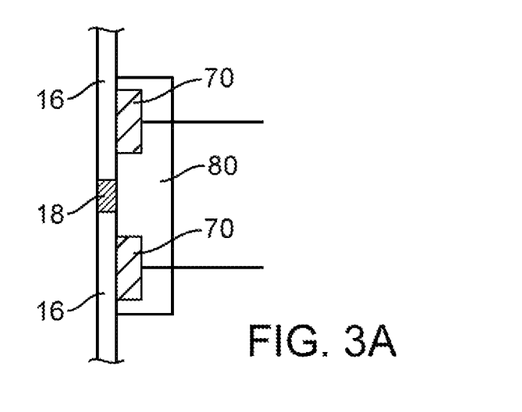
FIG. 3A is a top view of a portion of a conductive electronic device housing structure being tested using an electrically connected probe in accordance with an embodiment of the present invention.

As shown in FIG. 3A, one way in which the capacitance Cm of gap 18 may be measured is by making electrical contact with the portions of peripheral conductive housing member 16 on opposing sides of the gap using contacts 70. Contacts 70 may be exposed patterned metal pads on a substrate such as a flexible printed circuit substrate (dielectric substrate 80) or may be spring-loaded pins. In some situations, peripheral conductive housing member 16 may be formed from a metal (e.g., stainless steel) that has a non-negligible contact resistance when probed by spring-loaded pins or other contact-based probes. The surface of member 16 may also be susceptible to scratching when probed using pins. It may therefore be desirable to use a capacitively coupled probe arrangement of the type shown in FIG. 3B.

Figure 3B:
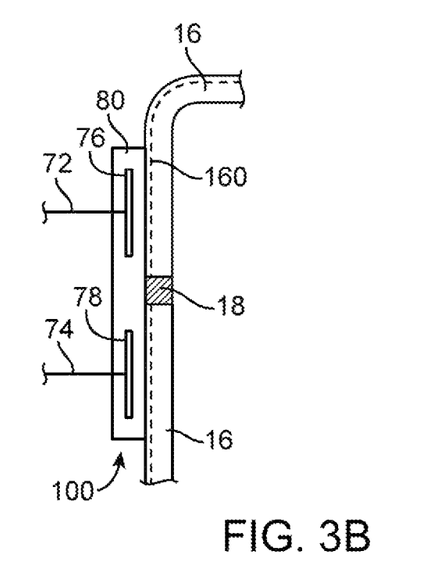
FIG. 3B is a top view of a portion of a conductive electronic device housing structure being tested using a capacitive coupling probe in accordance with an embodiment of the present invention.

In the FIG. 3B configuration, first and second probe terminals 72 and 74 are electrically connected to respective first and second probe pads 76 and 78 (sometimes referred to as first and second electrodes) in dielectric 80 of capacitive coupling probe 100. Probe terminals 72 and 74 may be placed in contact with first and second probe pads 76 and 78 using a robot or other computer-controlled positioner or manually. If desired, terminals 72 and 74 may be wires or other conductive paths associated with a cable and may be soldered directly to pads 76 and 78 without using a probe. Dielectric 80 may be, for example, a sheet of polymer such as a polyimide sheet in a flexible printed circuit ("flex circuit"). Probe pads 76 and 78 may be formed from metal traces in the flex circuit. When placed against peripheral conductive housing member 16, pad 76 and member 16 form a first parallel plate capacitor and pad 78 and peripheral conductive housing member 16 form a second parallel plate capacitor. Because pins are not used to directly probe member 16, member 16 will generally not be scratched during testing, which may be helpful when member 16 has a cosmetic surface that should not be damaged during testing. Dielectric 80 covers electrodes 76 and 78 and, when probe 100 is placed against conductive member 16 during testing, dielectric 80 electrically isolates (insulates) electrodes 76 and 78 from conductive member 16. Because electrical coupling is achieved without requiring direct metal-to-metal contact between the probe electrodes and member 16, satisfactory electrical coupling can be achieved at radio-frequencies even in the presence of an oxide or other coating that may give rise to a non-negligible contact resistance when probing the conductive structure with pins.

As shown in FIG. 3B, member 16 may, if desired, be covered with a dielectric coating such as coating 160. For example, member 16 may be a metal member coated with a layer of plastic (i.e., coating 160 may be plastic and may be associated with a protective coating, a logo on a housing member, a cosmetic trim, or other structures), a native oxide such as a native oxide on stainless steel or other metals having a thickness of less than 5 microns, or other dielectric films. Interior portions of conductive structures, exterior portions (i.e., cosmetic exterior portions), combinations of interior and exterior portions, or other suitable areas on conductive structures such as member 16 may be probed if desired.

Figure 4:
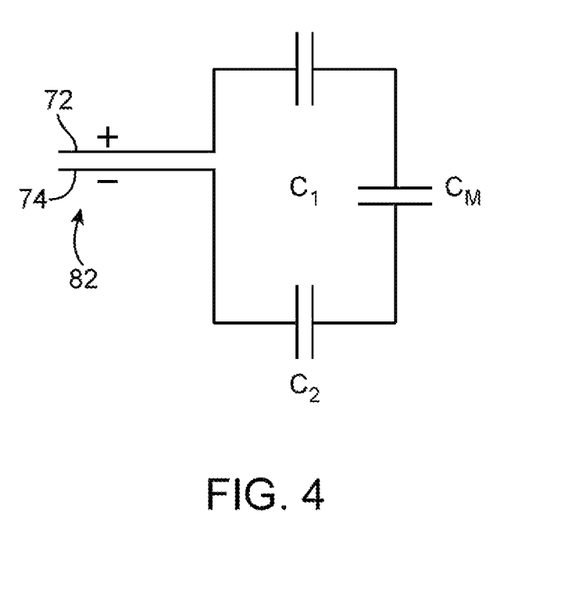
FIG. 4 is a circuit diagram of a circuit that is formed with a probe that is capacitively coupled to a peripheral conductive housing member with a gap in accordance with an embodiment of the present invention.

As shown in FIG. 4, signal path 82 (e.g., a coaxial cable or other transmission line) may have positive conductor 72 and ground conductor 74 (coupled to terminals 72 and 74 respectively in FIG. 3B). Transmission line path 82 may convey signals to and from the probe of FIG. 3B during testing. Capacitor C1 represents the capacitance formed by pad 76 and peripheral conductive housing member 16. Capacitor C2 represents the capacitance formed by pad 78 and peripheral conductive housing member 16. Capacitance Cm may be associated with gap 18. In a typical configuration, the magnitudes of capacitors C1 and C2 may be about five to ten times greater or more than the capacitance Cm, so the behavior of the series capacitance measured between terminals 72 and 74 will tend to be dominated by the behavior of the capacitance Cm of gap 18. Series capacitance measurements between terminals 72 and 74 other electrical measurements such as complex impedance measurements that are affected by capacitance Cm may therefore be used in evaluating the size of gap 18. Information on the size of gap 18 may be used in determining whether the conductive electronic device structures under test (e.g., member 16 with gap 18) or an antenna resonating element or other conductive structures have been manufactured satisfactorily.

Figure 5:
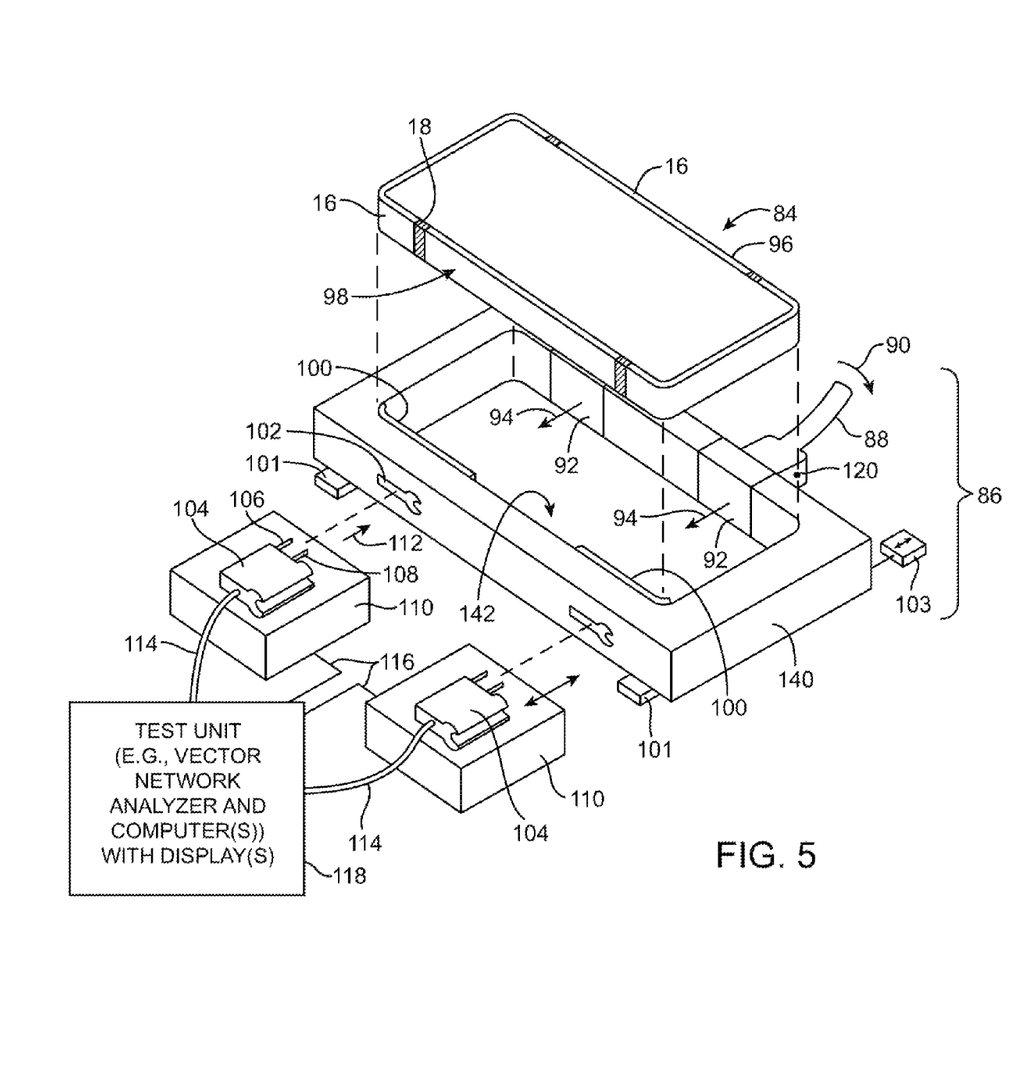
FIG. 5 is an exploded perspective view of illustrative electronic device structures under test in a test system in accordance with an embodiment of the present invention.

FIG. 5 is a perspective view of an illustrative test system in which device structures under test 84 are being tested in test fixture 86. Device structures under test 84 may include structures used in forming an electronic device such as electronic device 10 of FIGS. 1 and 2. For example, device structures under test 84 may include conductive housing structures such as peripheral conductive housing member 16. Member 16 may have one or more dielectric-filled gaps 18. Testing of device structures under test 84 may reveal whether member 16 contains a fault (e.g., whether or not gaps 18 are sized appropriately).

Fixture 86 may have a fixture base such as base 140. Base 140 may be formed from a dielectric such as plastic (as an example). Base 140 may have a cavity such as cavity 142 that receives device structures under test 84 during testing.

When device structures under test 84 are placed within cavity 142, levers 88 may be moved downwards in direction 90 around pivot 120. This causes movable retention members 92 to move inwardly in direction 94 to serve as biasing structures that press against surface 96 of device structures under test 84. When surface 96 is pressed in direction 94, surface 98 is held firmly against probes 100 in cavity 142 of base 140, ensuring satisfactory capacitive coupling between capacitive coupling probes 100 and member 16 during testing. Probes 100 may, if desired, have screen-printed alignment marks between their respective electrodes to help align structures 84 and probes 100.

Base 140 may have openings such as openings 102. Openings 102 may be configured to receive mating spring-loaded probes 104. For example, openings 102 may have an interior shape that matches the exterior shape of probes 104. Each probe 104 may have a positive spring-loaded pin such as spring loaded pin 106 and a ground spring-loaded pin such as pin 108. The shapes of openings 102 and probes 104 may be asymmetric ("keyed") to ensure that probes 104 are inserted within openings 102 using a desired polarity. When moved in direction 112 by biasing structures 110, probes 104 may be received within openings 102 of fixture base 140, so that pins 106 and 108 mate with respective contact pads on probe 100 (i.e., pins 106 and 108 may be shorted to pads 76 and 78 of FIG. 3B, respectively).

Biasing structures 110 may include a solenoid-based actuator, a pneumatic actuator, spring members to apply biasing force in direction 112, or other suitable biasing structures. These structures may be passive (e.g., fixed springs) or may be manually or automatically controlled. For example, biasing structures 110 may be coupled to test unit 118 by control paths 116. Test unit 118 may contain one or more computers or other computing equipment that issues commands to biasing structures 110 using paths 116. Fixture 140 may slide on rails such as rails 101. The position of fixture 140 may be adjusted manually or using a positioner such as computer-controlled positioner 103 that can be adjusted using computers in test unit 118. Using positioner 103 and/or positioners 110, test structure 16 and probes 104 may be moved relative to each other to obtain optimal probe compression and placement.

Cables 114 may be coaxial cables or other transmission lines that are capable of transmitting and receiving radio-frequency signals. Cables 114 may be coupled between probes 104 and test unit 118. Test unit 118 may include a network analyzer such as a vector network analyzer (VNA) or other test equipment that is capable of generating and receiving radio-frequency test signals. Radio-frequency test measurements made on device structures under test 84 using test unit 118, probes 104, and probes 100 may be analyzed using computing equipment in a network analyzer or using associated computing equipment such as an associated computer or network of computers. The computing equipment may include input-output devices such as a keyboard, mouse, and display. When testing reveals that device structures under test 84 are performing satisfactorily, an operator of the test system may be provided with a visible alert using a display in test unit 118 or other suitable actions may be taken. An operator may also be alerted in this way when testing reveals that device structures under test 84 contain a fault and are therefore not performing satisfactorily.

The arrangement of FIG. 5 includes a pair of probes 104. These probes may be used individually or may be operated simultaneously. Additional capacitive coupling probes and other types of probes may be used in test fixture 86 if desired.

Figure 6:
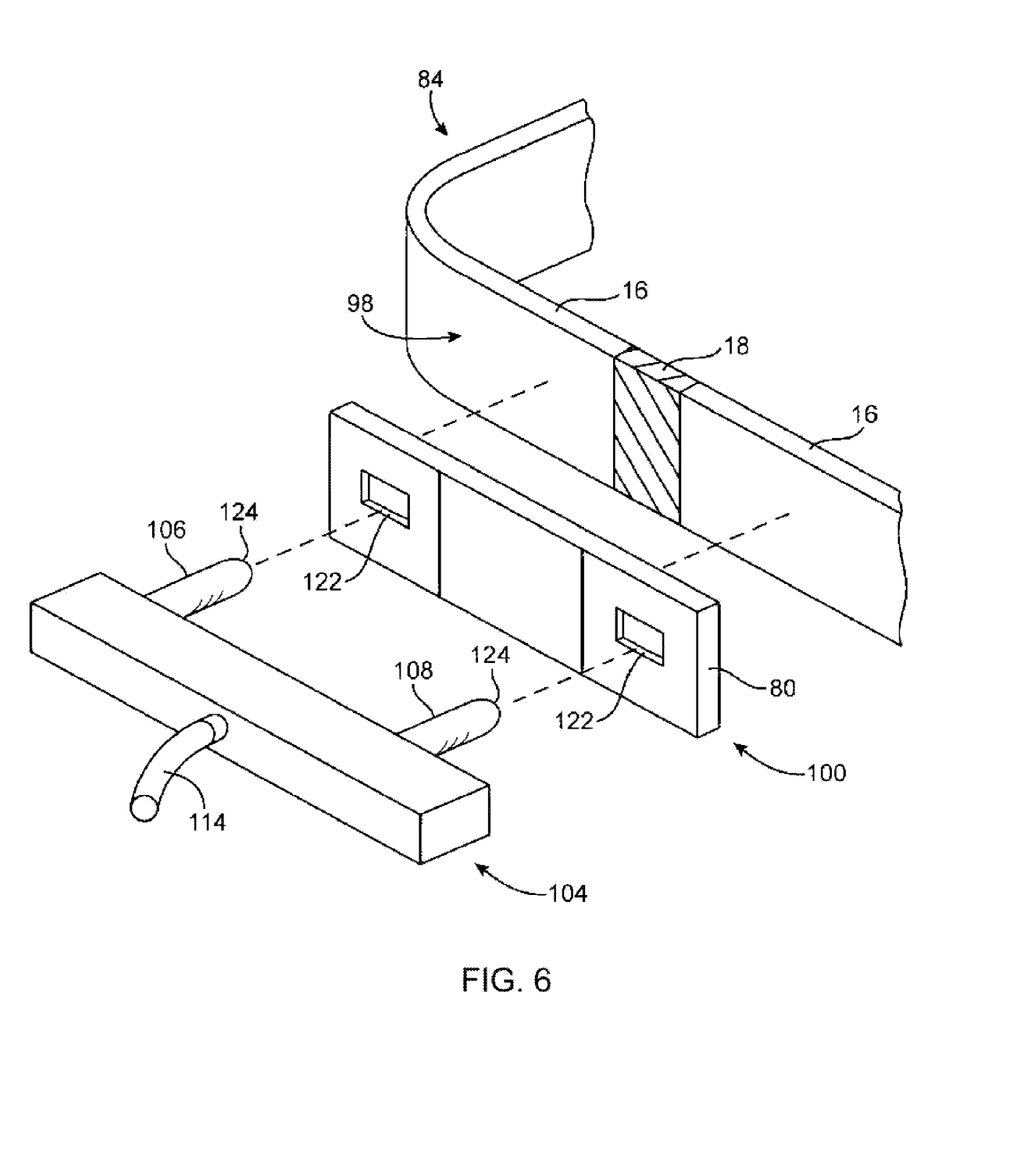
FIG. 6 is an exploded perspective view of a portion of a peripheral conductive housing member with a gap and an associated capacitive coupling probe and a probe with mating spring-loaded pins in accordance with an embodiment of the present invention.

An exploded perspective view of some of the components of the test system of FIG. 5 is shown in FIG. 6. As shown in FIG. 6, probe 104 may include contacts such as spring-loaded pins 106 and 108 and a cable such as cable 114 having positive and ground conductive lines coupled respectively to pins 106 and 108. Probe 100 may have a dielectric substrate such as a flex circuit substrate (substrate 80). Openings such as openings 122 may be used to expose contact pads in probe 100 (i.e., contact pads that allow gold-plated tips 124 of pins 106 and 108 to electrically connect with respective pads 76 and 78 of FIG. 3B). During testing, probe 100 may be placed against outer surface 98 of member 16 to capacitively couple probe 100 to member 16.

Figure 7:
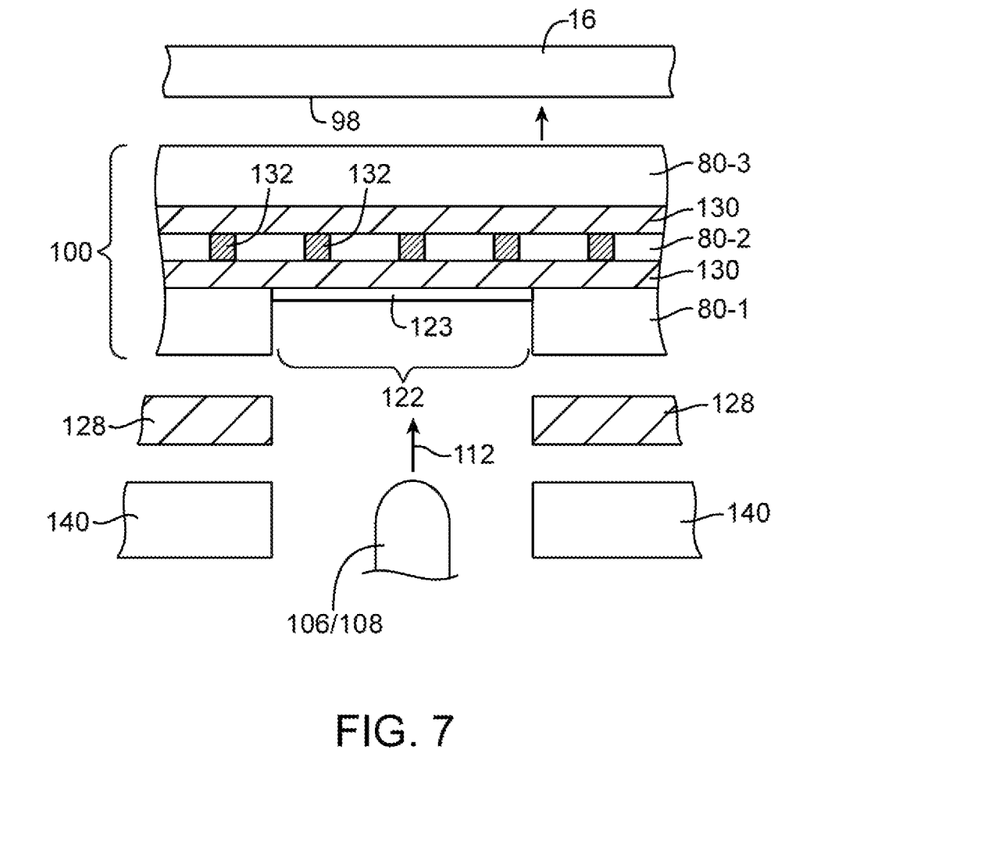
FIG. 7 is a cross-sectional top view of test system components and associated electronic device structures under test in accordance with an embodiment of the present invention.

FIG. 7 contains a cross-sectional view of probe 100. As shown in FIG. 7, the dielectric substrate of probe 100 may include one or more layers such as layers 80-1, 80-2, and 80-3. Layers 80-1, 80-2, and 80-3 may be polymer layers (sub-layers) such as layers of polyimide in a flex circuit layer. Layer 80-3 may have a thickness of about 20-30 microns (as an example). Layers 80-2 and 80-1 may have thicknesses of about 20-70 microns (as an example). One or more metal layers such as metal layers 130 may be patterned to form pads for probe 100 such as pads 76 and 78 of FIG. 3B. In configurations with multiple metal layers, intervening vias such as metal vias 132 may be used to short the metal layers together to form unitary pad structures. Opening 122 in outermost polymer layer 80-1 may be used to allow contact with pins 106 and 108 when pins 106 and 108 are moved in direction 112 by biasing structures 110. A coating of metal such as gold 123 may be used on metal 130 to reduce contact resistance and prevent oxidation.

Test measurement accuracy may be enhanced by ensuring that probe 100 is placed in firm contact with surface 98 of member 16. This helps ensure that the distance between metal 130 and the metal of member 16 is uniform and is dictated by the known thickness of dielectric layer 80-3. With one suitable biasing arrangement, which may be helpful when biasing probe 100 against a curved portion of member 16, a compressible elastomeric substance such as polymer foam 128 may be interposed between the wall of fixture base 140 and probe 100 as shown in FIG. 7. When device structures under test 84 (FIG. 5) are inserted into test fixture 86, foam 128 will be compressed and will bias probe 100 in direction 112 towards surface 98. If desired, other biasing structures may be used between probe 100 and the inner surface of fixture base 140 (e.g., springs, spring-based and actuator-based pushing mechanisms, levers, etc.). The biasing structures may be formed from plastic, metal, other materials, combination of these materials, etc. The use of a foam biasing member is merely illustrative.

Figure 8:
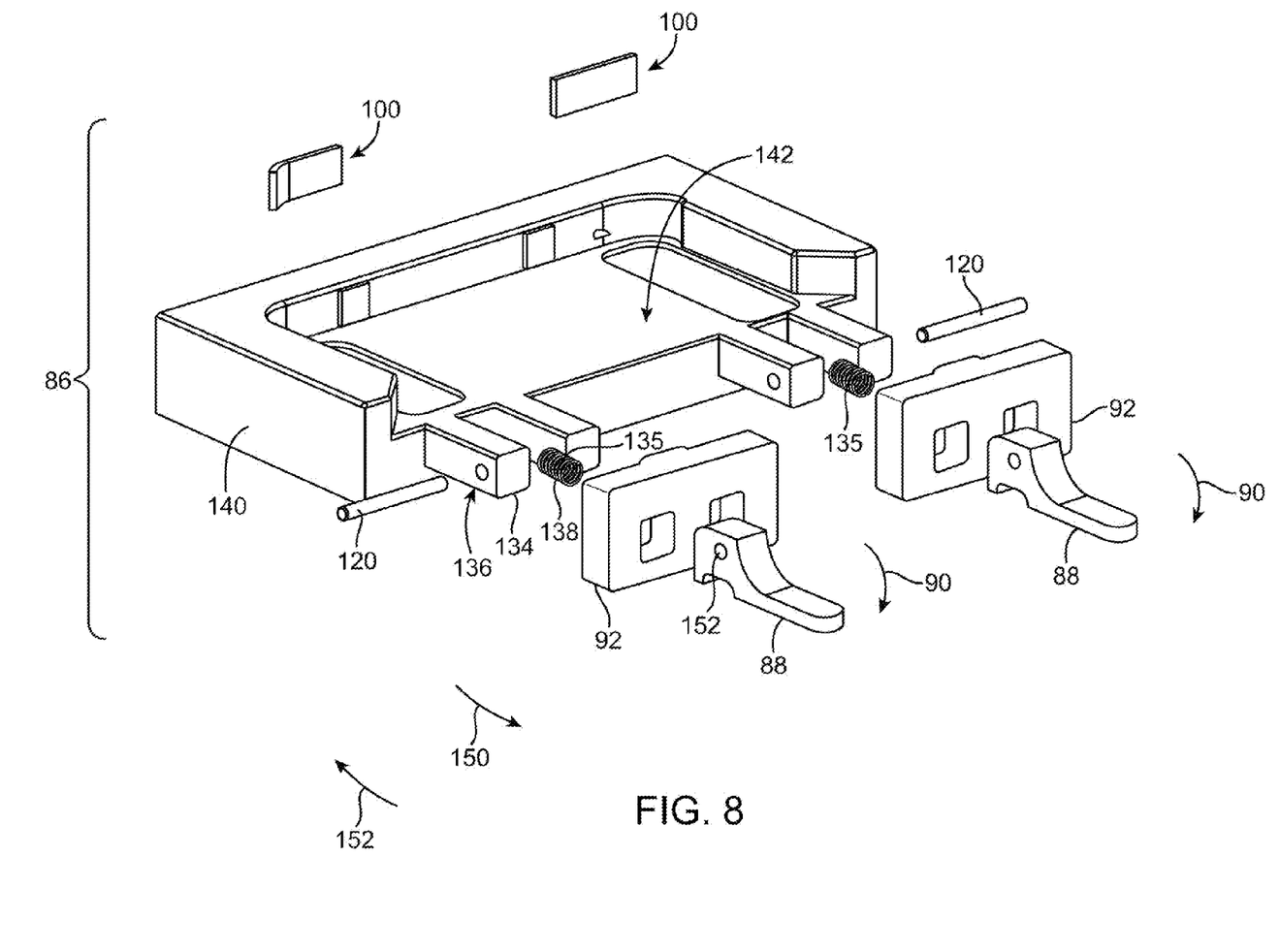
FIG. 8 is an exploded perspective view of an illustrative test fixture in accordance with an embodiment of the present invention.

An exploded perspective view of test fixture 86 is shown in FIG. 8. As shown in FIG. 8, test fixture 86 may include base 140. Base 140 may have a cavity such as a substantially rectangular cavity (cavity 142) for receiving device structures under test 84 (FIG. 5). Retention members 92 may have holes or other features that allow retention members to slide along rails 134 in base 140. Springs 135 bias retention members 92 in direction 150. When assembled, pivot members 120 are placed in holes 136 of rails 134 (passing through holes 152 in levers 88). Springs 135 push retention member 92 in direction 150 and create space within cavity 142 for structure 84. When levers 88 are moved downward in direction 90, levers 88 push retention member 92 in direction 152 and hold device structures under test 84 firmly against probes 110 within cavity 142.

Figure 9:
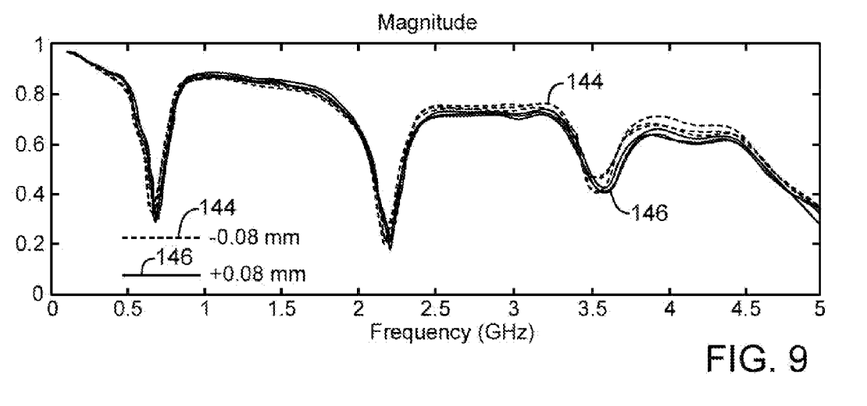
FIG. 9 is a graph of illustrative impedance magnitude data of the type that may be gathered using a test system in accordance with an embodiment of the present invention.
Figure 10:
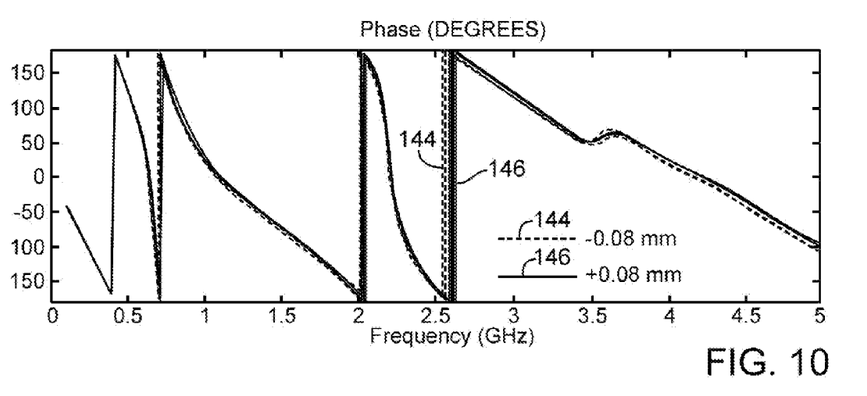
FIG. 10 is a graph of illustrative impedance phase data of the type that may be gathered using a test system in accordance with an embodiment of the present invention.
Figure 11:
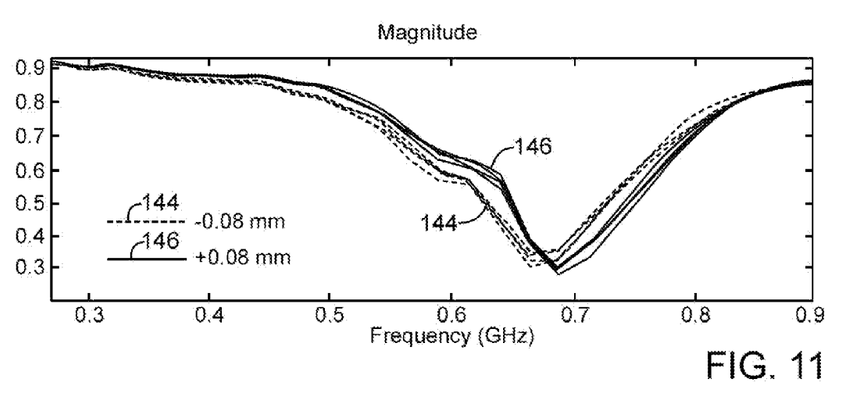
FIG. 11 is a graph of a subsection of the impedance magnitude data of FIG. 9 showing how the measured impedance may vary as a function of the size of a gap in a peripheral conductive housing structure in accordance with an embodiment of the present invention.

FIGS. 9, 10, and 11 show illustrative test measurements that may be made using a test system of the type shown in FIG. 5. In general, any suitable characterizing electrical measurements may be made on structures 84 (impedance, capacitance, inductance, etc.). Radio-frequency measurements that are sensitive to the size of gap 18 may, for example, be made to reveal whether or not gaps 18 and member 16 have been manufactured properly. With one suitable arrangement, which is sometimes described herein as an example, radio-frequency complex impedance measurements (sometimes referred to as S11 parameter measurements) are made by transmitting signals and measuring how much of the transmitted signals are reflected. Phase and magnitude impedance measurements may be made. If desired, radio-frequency signals may be transmitted using one of the electrodes (e.g., electrode 76) and received using another of the electrodes (e.g., electrode 78) to make S21 measurements (sometimes referred to as forward transfer coefficient measurements). An example of a situation in which S21 measurements may be made is when testing a cosmetic surface that runs along an exterior portion of an electronic device. The use of flex circuit electrodes such as electrodes 76 and 78 helps prevent scratches to the cosmetic surface. The S21 measurement may be made by placing electrode 76 at one end of the cosmetic surface and by placing electrode 78 at another end of the cosmetic surface. The cosmetic surface may form a ground structure, part of an antenna, or other structure in an electronic device. The S21 measurements may reveal defects that might affect antenna performance or other device operations.

In the graph of FIG. 9, complex impedance magnitude has been measured as a function of signal frequency over a frequency range of 0 to 5 GHz. In making these measurements, test unit 118 (e.g., a vector network analyzer) transmits radio-frequency signals and measures the reflected radio-frequency signals from the device structures under test. In the graph of FIG. 10, complex impedance phase (i.e., S11 phase) has been measured over the illustrative 0 to 5 GHz frequency range. FIG. 11 is a complex impedance magnitude plot covering a subset of the frequencies of FIG. 9. In particular, the data of FIG. 11 spans the frequency range of about 0.25 GHz to 0.9 GHz. Other frequency ranges may be used when gathering complex impedance data, if desired. For example, complex impedance data (or other suitable electrical characterization data) may be gathered over a frequency range of at least 0.4 to 0.8 GHz, over a frequency range of at least 0.6 to 0.8 GHz, etc.

Two different sets of conductive electronic device structures under test were measured to obtain the curves of FIGS. 9, 10, and 11. In the first set of device structures under test, member 16 has a gap that is 0.08 mm larger than the nominal 0.7 mm width of gap 18. The 0.08 mm extra width of gap 18 in this situation may represent the largest allowable gap size that will result in acceptable performance for device 10 when gap 18 and member 16 are incorporated into an antenna in a finished device. Data corresponding to these device structures under test is represented by curves 144. In the second set of device structures under test, member 16 has a gap that is 0.08 mm smaller than its nominal 0.7 mm width. Data for the smaller-than-normal gaps is represented by curves 146.

As shown by curves 144 and 146 of FIGS. 9, 10, and 11, there is a measureable difference in the electrical properties of device structures under test 84 when device structures under test 84 are subjected to manufacturing variations. In the present example, variations in the width of gap 18 in member 16 that forms part of an antenna have been characterized. If desired, other types of manufacturing variations that affect the electrical properties of device structures under test 84 may be characterized (e.g., changes in the size and shape of other conductive housing members, changes in the size and shape of electrical components in device structures under test 84, etc.).

Figure 12:
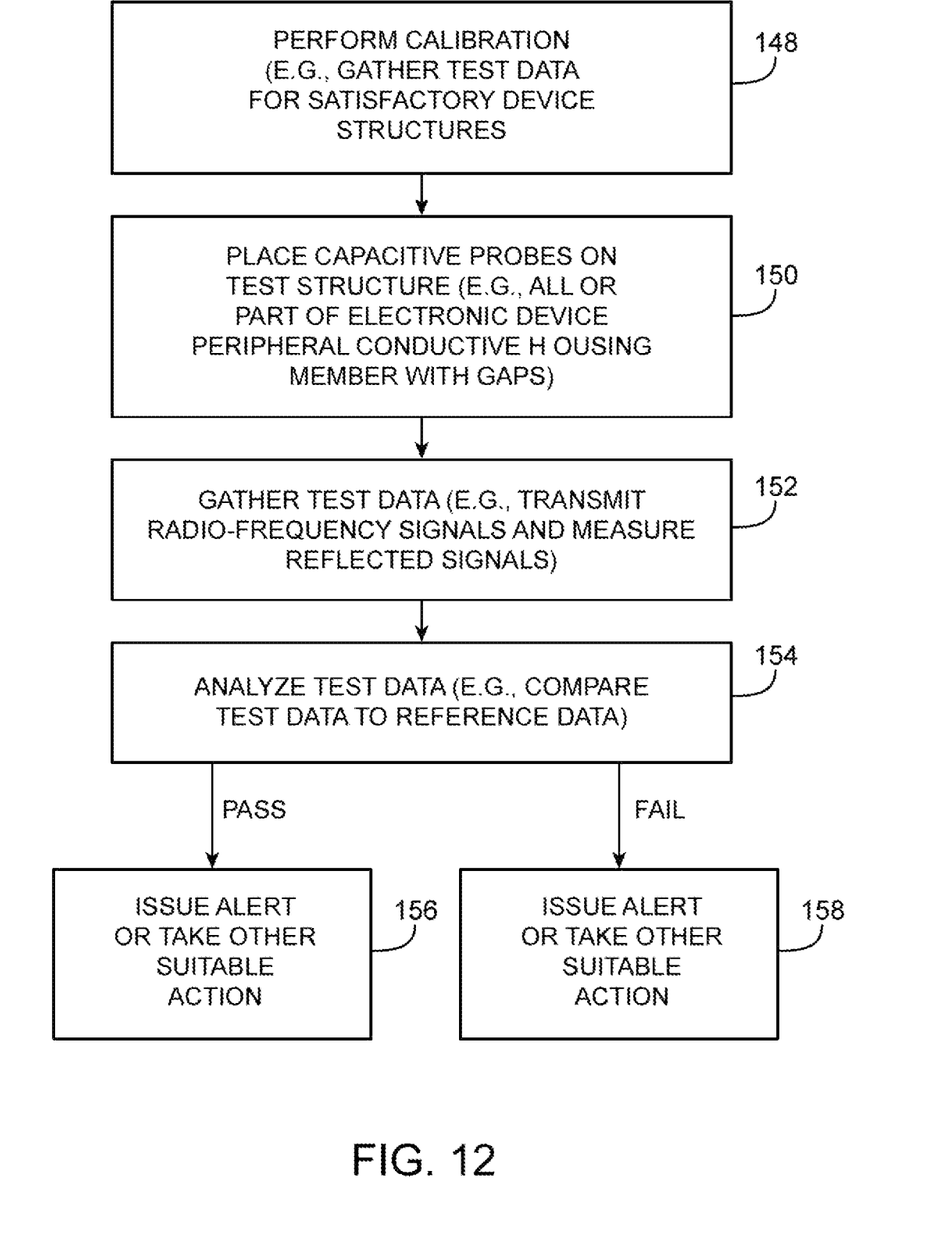
FIG. 12 is a flow chart of illustrative steps involved in using a test system of the type shown in FIG. 5 in testing electronic device structures in accordance with an embodiment of the present invention.

Illustrative steps involved in testing device structures under test 84 using a test system of the type shown in FIG. 5 are shown in FIG. 12.

At step 148, a test system operator may place one or more versions of electronic device structures under test 84 that have known characteristics in test fixture 86 and may gather corresponding test results. For example, impedance measurements and/or forward transfer coefficient measurements (magnitude and/or phase) may be obtained over a range of frequencies, as described in connection with FIGS. 9, 10, and 11. The structures that are measured in this way may include substantially perfect (fault-free) structures and/or structures that exhibit acceptable manufacturing variations. For example, the structures that are measured may be members 16 that include gaps 18 that are at or near the limit of allowed variations in size from a nominal size of 0.7 mm (e.g., +/−0.08 mm). The test measurement data that is gathered during the operations of step 148 may be stored in test unit 118 to serve as baseline data (sometimes referred to as reference data or calibration data) to which subsequent test data may be compared when testing device structures of unknown quality during manufacturing.

After gathering baseline data on device structures with known characteristics (e.g., known gap sizes and/or gap capacitances) during the operations of step 148, device structures may be tested in a production environment. In particular, during the operations of step 150, a test system operator may repeatedly place device structures under test 84 into test fixture 86 and, during the operations of step 152, may gather test data on those structures. The test structures that are placed in test fixture 86 may include conductive structures such as band 16 with gaps 18 that form part of one or more electronic device antennas or may be other conductive device structures. When inserted into test fixture 86, levers 90, retention members 92, and biasing structures such as foam 128 (FIG. 7) may be used to hold capacitive coupling probes such as probe 100 of FIG. 6 in place against band 16 (or other conductive structures being tested). Biasing structures 110 may be used to hold spring-loaded pin probes 104 in place. When gathering test data during the operations of step 152, test unit 118 may transmit radio-frequency signals and may receive reflected radio-frequency signals. The transmitted and received signals may be processed (e.g., to compute magnitude and phase impedance measurements to estimate the gaps size and/or capacitance Cm associated with gaps 18, etc.). Test unit 118 may also transmit radio-frequency signals with one probe structure and may gather radio-frequency signals with another probe structure (i.e., to gather forward transfer coefficient measurements).

At step 154, the test data that has been gathered from the device structures under test may be compared to the reference data that was collected during the calibration operations of step 148. In particular, the test data may be evaluated to determine whether or not the test data deviates by more than an acceptable amount from the baseline data gathered during the operations of step 148. In response to a determination that the test data is within acceptable limits, test unit 118 may issue a corresponding alert to the test system operator (e.g., by displaying a "pass" message or other suitable information on a display in test unit 118 or by issuing an audio alert) or may take other suitable actions (step 156). In response to a determination that the test data has varied from the reference data by more than acceptable limits, test unit 118 may issue an alert that informs the system operator that the device structures under test have failed testing or may take other suitable action (step 158). Structures that have passed testing may, for example, be assembled into finished products and sold to customers. Structures that have failed testing may be reworked or scrapped.

Figure 13:
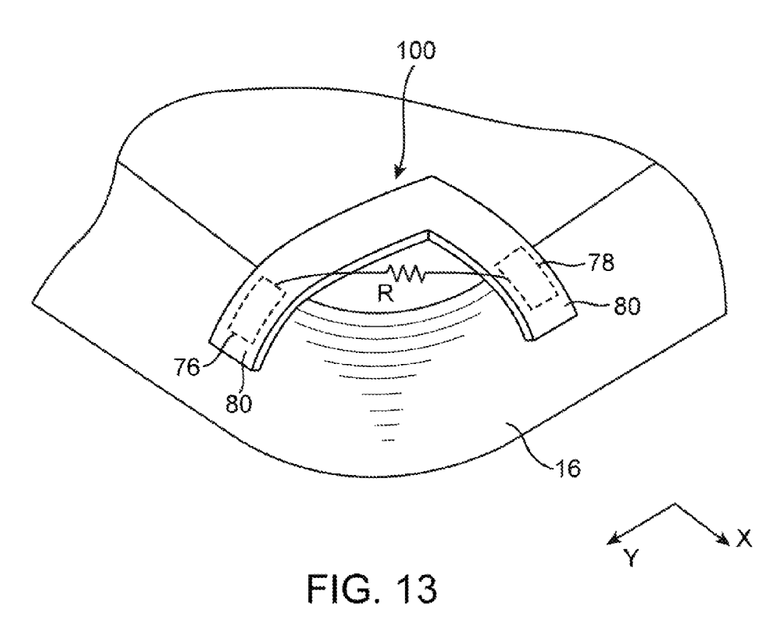
FIG. 13 is a perspective view showing how flex circuit electrodes in a capacitively coupled probe may conform to an electronic device structure having compound curves in accordance with an embodiment of the present invention.

FIG. 13 is a perspective view showing how flex circuit electrodes in a capacitively coupled probe may conform to an electronic device structure having compound curves (i.e., a surface that curves in an arc parallel to dimension x and dimension y in the FIG. 13 example). As shown in FIG. 13, probe 100 may be formed form a flexible dielectric such as flex circuit 80 that contains capacitive electrodes for coupling with curved surfaces of conductive structures 16 (e.g., a surface of an electronic device housing with convex and/or concave compound curves). FIG. 13 also shows how shunt components may be used in probe 100. A resistor such as resistor R may, as an example, be used to bridge electrodes 76 and 78. Resistor R may, if desired, be formed from a surface mounted component that is soldered to the flex circuit substrate that forms probe 100.

Figure 14:
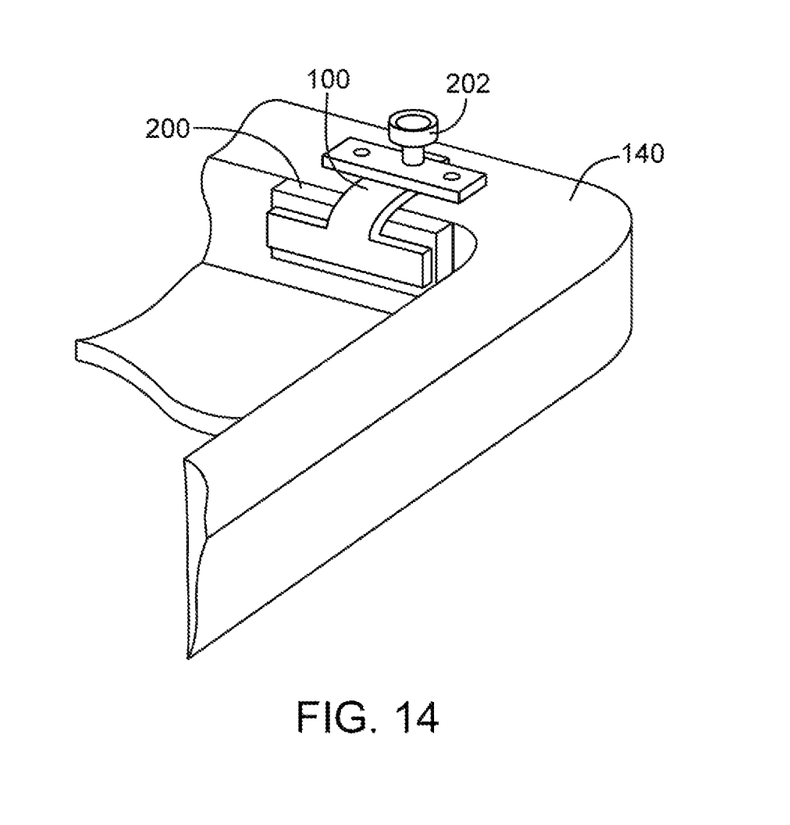
FIG. 14 is a perspective view of a portion of a test system showing how a connector may be mounted on a flex circuit probe in a fixture in accordance with an embodiment of the present invention.

FIG. 14 is a perspective view of a portion of a test system showing how a connector such as SMA (SubMiniature version A) connector 202 has been mounted on flex circuit probe 100. Foam 200 may be used to bias probe 100 against the surface of conductive structure 16 (FIG. 5) during testing. Connector 202 may be coupled to a mating connector at the end of a cable such as cable 114 of FIG. 5.

The foregoing is merely illustrative of the principles of this invention and various modifications can be made by those skilled in the art without departing from the scope and spirit of the invention.

What is claimed is:

1. A test system for testing conductive electronic device structures under test, comprising:
   a test unit;
   a fixture with a cavity that receives the conductive electronic device structures under test, wherein the fixture surrounds the conductive electronic device structures under test and the conductive electronic device structures under test comprise a conductive housing member that forms part of an antenna; and
   at least one capacitively coupled probe that is coupled to the test unit, wherein the capacitively coupled probe has a metal layer that forms at least a portion of an electrode that is configured to capacitively couple to the conductive electronic device structures under test and a dielectric layer that covers the metal layer and is interposed between the metal layer and the conductive electronic device structures under test when the conductive electronic device structures under test are received within the fixture, and the metal layer and the dielectric layer are interposed between the fixture and the conductive electronic device structures under test.

2. The test system defined in claim 1 further comprising a biasing member interposed between the fixture and the capacitively coupled probe that biases the capacitively coupled probe against the conductive electronic device structures under test such that the at least one dielectric layer is in direct contact with the conductive electronic device structures under test.

3. The test system defined in claim 2 wherein the biasing member comprises foam.

4. The test system defined in claim 1 further comprising: biasing structures that bias the at least one pin towards the metal layer.

5. The test system defined in claim 1 wherein the fixture comprises biasing structures that hold the conductive electronic device structures under test within the fixture and the biasing structures bias the conductive electronic device structures under test towards the dielectric layer such that the conductive electronic device structures under test are in direct contact with the dielectric layer.

6. The test system defined in claim 5 wherein the biasing structures comprise movable retention members.

7. The test system defined in claim 6 further comprising levers that move the movable retention members.

8. The test system defined in claim 7 further comprising springs coupled to the movable retention members.

9. The test system defined in claim 1 wherein the test unit is configured to measure test data with the capacitively coupled probe and wherein the test data is selected from the group consisting of: inductance data, impedance data, and capacitance data.

10. The test system defined in claim 1, wherein the at least one capacitively coupled probe comprises at least one positive pin and at least one ground pin, wherein the fixture has an asymmetric opening and wherein the probe has a mating shape to ensure that the probe is inserted in the opening with a desired polarity.

11. The test system defined in claim 1, wherein the dielectric layer electrically isolates the metal layer from the conductive electronic device structures under test.

12. The test system defined in claim 1, wherein the test unit comprises a vector network analyzer.

13. The test system defined in claim 1, wherein the test unit is configured to generate and receive radio-frequency test signals.

14. The test system defined in claim 1, wherein the dielectric layer has a thickness of 20 to 30 microns.

15. A test system for testing conductive electronic device structures under test, comprising:
    a test unit;
    a test fixture having a cavity for receiving the conductive electronic device structures under test; and
    a test probe that is coupled to the test unit and that is capacitively coupled to the conductive electronic device structures under test via an electrode, wherein the test unit is configured to convey test signals over the test probe and the electrode, the test probe comprises at least one positive pin and at least one ground pin that protrude through an asymmetric opening in the test fixture, and the test probe has a mating shape to ensure that the test probe is inserted in the asymmetric opening with a desired polarity.

16. The test system defined in claim 15, further comprising a dielectric layer interposed between the electrode and the conductive electronic device structures under test, wherein the dielectric layer contacts the electrode and the conductive electronic device structures under test during testing.

17. The test system defined in claim 15, wherein the test probe is capacitively coupled to a first side of the conductive electronic device structures under test, further comprising:
    biasing structures formed in the test fixture at a second side of the conductive electronic device structures under test that opposes the first side, wherein the biasing structures are configured to hold the conductive electronic device structures under test within the fixture.

18. A test system for testing conductive electronic device structures under test of an electronic device, comprising:
   a test unit configured to generate test signals;
   a first test probe that is capacitively coupled to the conductive electronic device structures under test via a first electrode, wherein the conductive electronic device structures under test comprise a conductive housing member that runs around the periphery of the electronic device, the first test probe is capacitively coupled to the conductive housing member, and the first test probe is configured to provide the test signals to the conductive housing member; and
   a second test probe that is capacitively coupled to the conductive housing member via a second electrode, wherein the second test probe is configured to receive the test signals from the conductive housing member.

19. The test system defined in claim 18, further comprising:
   a test fixture in which the conductive electronic device structures under test are placed during testing.

20. The test system defined in claim 18, wherein the electronic device has planar front and rear surfaces and the conductive housing member surrounds a periphery of the planar front and rear surfaces.

21. The test system defined in claim 18, wherein the electronic device has a display.

22. The test system defined in claim 18, wherein the conductive housing member forms part of an antenna for the electronic device.

23. The test system defined in claim 22, wherein the conductive housing member has a gap filled with dielectric, the gap has first and second opposing sides, the first test probe is capacitively coupled to the conductive housing member at the first side of the gap, and the second test probe is capacitively coupled to the conductive housing member at the second side of the gap.

* * * * *